United States Patent
Oasa et al.

(10) Patent No.: US 9,627,504 B2
(45) Date of Patent: Apr. 18, 2017

(54) SEMICONDUCTOR DEVICE

(71) Applicant: KABUSHIKI KAISHA TOSHIBA, Tokyo (JP)

(72) Inventors: Kohei Oasa, Nonoichi Ishikawa (JP); Akira Yoshioka, Nomi Ishikawa (JP); Yasuhiro Isobe, Kanazawa Ishikawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/635,338

(22) Filed: Mar. 2, 2015

(65) Prior Publication Data

US 2016/0079406 A1 Mar. 17, 2016

(30) Foreign Application Priority Data

Sep. 12, 2014 (JP) .................................. 2014-186154

(51) Int. Cl.
*H01L 29/778* (2006.01)
*H01L 29/20* (2006.01)
(Continued)

(52) U.S. Cl.
CPC ...... *H01L 29/66462* (2013.01); *H01L 21/308* (2013.01); *H01L 21/30612* (2013.01);
(Continued)

(58) Field of Classification Search
USPC .......................................................... 257/76
See application file for complete search history.

(56) References Cited

U.S. PATENT DOCUMENTS

2004/0094793 A1* 5/2004 Noguchi ............... H01L 27/105
257/315
2012/0043588 A1* 2/2012 Iwabuchi ............ H01L 29/1029
257/194
(Continued)

FOREIGN PATENT DOCUMENTS

JP 2012-248636 A 12/2012
JP 2012248632 A 12/2012

OTHER PUBLICATIONS

Taiwan Office Action dated Sep. 23, 2016, filed in Taiwan counterpart Application No. 104106726, 6 pages (with translation).

*Primary Examiner* — Thao P Le
(74) *Attorney, Agent, or Firm* — Patterson & Sheridan, LLP

(57) ABSTRACT

A semiconductor device includes a first semiconductor layer, a second semiconductor layer over the first semiconductor layer, source and drain electrodes over the second semiconductor layer, a gate electrode, and a first field plate electrode. The second semiconductor layer includes a first semiconductor portion and a second semiconductor portion thinner than the first semiconductor portion. The source and drain electrodes are electrically connected to the second semiconductor layer. The gate electrode is provided over the second semiconductor layer between the source electrode and the drain electrode. The first field plate electrode is provided over the second semiconductor layer and includes a portion that extends from a location over the gate electrode toward the drain electrode and has an end portion that is positioned over the second semiconductor portion.

10 Claims, 8 Drawing Sheets

(51) Int. Cl.
  *H01L 29/66*   (2006.01)
  *H01L 21/306*  (2006.01)
  *H01L 21/308*  (2006.01)
  *H01L 29/423*  (2006.01)
  *H01L 29/06*   (2006.01)
  *H01L 29/10*   (2006.01)
  *H01L 29/40*   (2006.01)

(52) U.S. Cl.
  CPC ...... *H01L 29/0657* (2013.01); *H01L 29/1033* (2013.01); *H01L 29/4236* (2013.01); *H01L 29/7786* (2013.01); *H01L 29/2003* (2013.01); *H01L 29/404* (2013.01); *H01L 29/42368* (2013.01)

(56) References Cited

U.S. PATENT DOCUMENTS

| | | | |
|---|---|---|---|
| 2013/0069115 A1* | 3/2013 | Nakazawa | H01L 29/402 257/192 |
| 2013/0083568 A1* | 4/2013 | Makiyama | H01L 29/66462 363/37 |
| 2013/0126942 A1* | 5/2013 | Nakajima | H01L 29/42316 257/192 |
| 2014/0016360 A1* | 1/2014 | Makiyama | H01L 29/778 363/16 |
| 2014/0361343 A1* | 12/2014 | Sriram | H01L 29/778 257/194 |
| 2016/0079406 A1* | 3/2016 | Oasa | H01L 29/7786 257/76 |

\* cited by examiner

SEMICONDUCTOR DEVICE

CROSS-REFERENCE TO RELATED APPLICATION

This application is based upon and claims the benefit of priority from Japanese Patent Application No. 2014-186154, filed Sep. 12, 2014, the entire contents of which are incorporated herein by reference.

FIELD

Embodiments described herein relate generally to a semiconductor device.

BACKGROUND

Nitride semiconductors have a large band gap as compared with silicon semiconductors. For this reason, a high breakdown voltage may be realized in semiconductor devices that use nitride semiconductors as the semiconductor material. However, the breakdown voltage may decrease because of a strong electric field locally caused by an increasing ON current when the semiconductor device is a transistor. An increased breakdown voltage is required in such a semiconductor device.

DETAILED DESCRIPTION

Figure 1A:
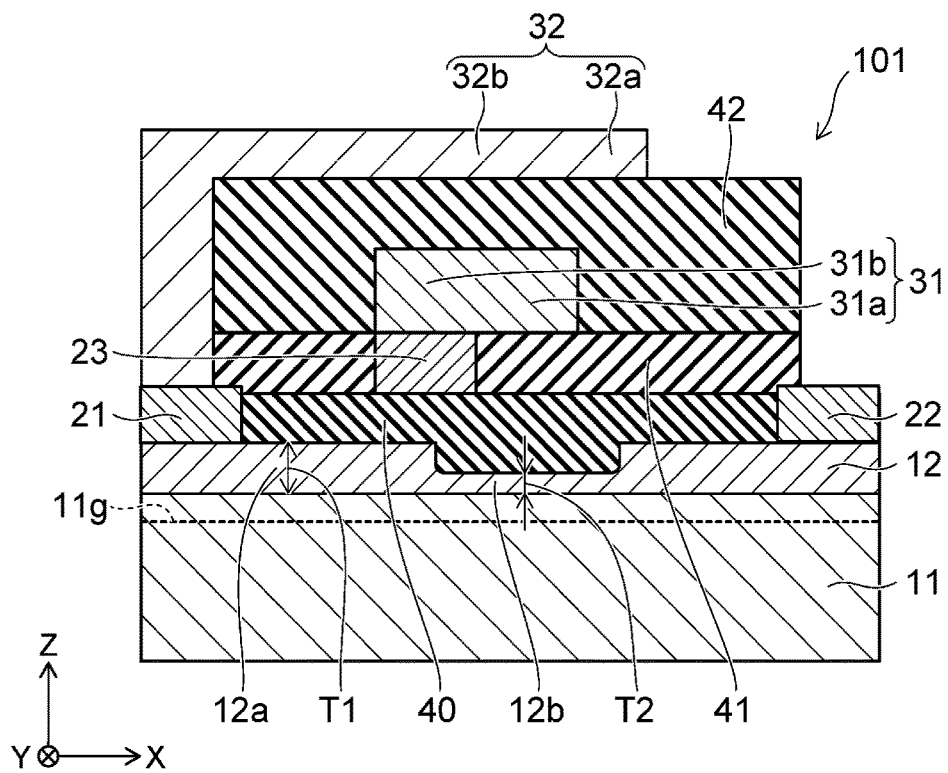
FIG. 1A and FIG. 1B are schematic views illustrating a semiconductor device according to a first embodiment.

Embodiments provide a semiconductor device that may have a higher breakdown voltage.

In general, according to one embodiment, a semiconductor device includes: a first semiconductor layer, a second semiconductor layer, a source electrode, a drain electrode, a gate electrode, and a first field plate electrode. The second semiconductor layer is provided over the first semiconductor layer and includes a first semiconductor portion and a second semiconductor portion thinner than the first semiconductor portion. The source electrode is provided over the second semiconductor layer and is electrically connected to the second semiconductor layer. The drain electrode is provided over the second semiconductor layer and is electrically connected to the second semiconductor layer. The gate electrode is provided over the second semiconductor layer between the source electrode and the drain electrode. The first field plate electrode is provided over the second semiconductor layer and includes a portion that extends from a location above the gate electrode toward the drain electrode. A first end of the first field plate electrode is positioned over the second semiconductor portion, and a second end of the first field plate electrode is positioned over the first semiconductor portion.

Hereinafter, each embodiment will be described with reference to the accompanying drawings.

Each drawing is schematic or conceptual. Thus, the relationship between the thickness and the width of each part and the size ratio between each part are not necessarily the same as those in an actual device. In addition, dimensions of, or a ratio between, parts may be represented differently depending on the drawing even if the parts are the same.

In the present disclosure, the same device elements as those described previously in the drawings are given the same reference signs, and detailed descriptions thereof are omitted as appropriate.

For convenience of description, the terms "over" and "under" are used in the present disclosure.

The phrase "provided over" is assumed to include not only a case where "the upper thing provided over another" is directly in contact with "the lower thing provided under another" but also a case where another element is interposed between the two things.

First Embodiment

Figure 1B:
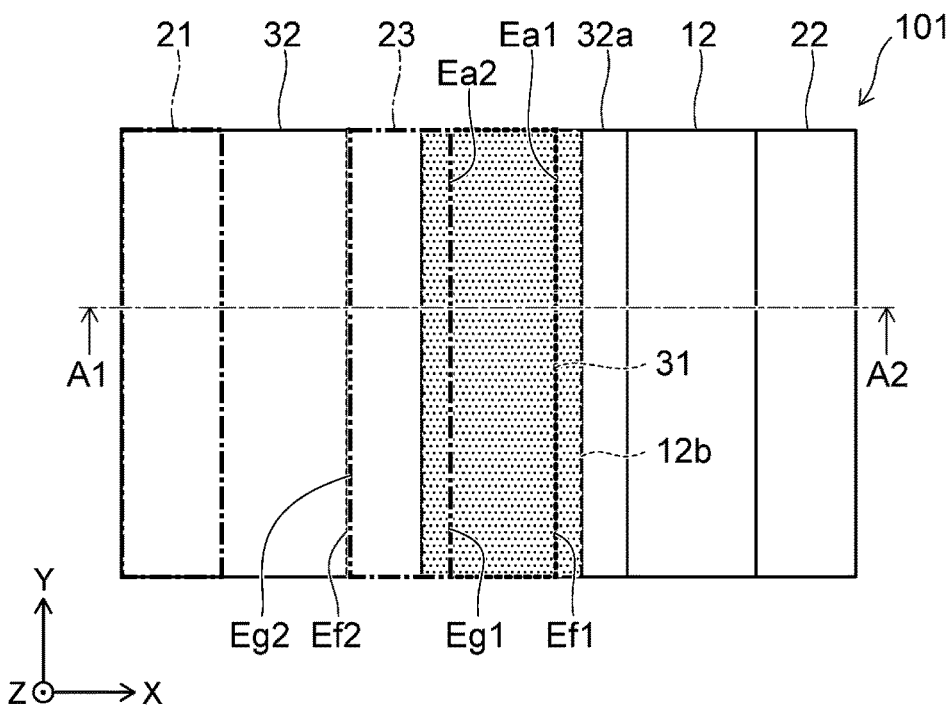

FIG. 1A and FIG. 1B are schematic views illustrating a semiconductor device according to a first embodiment.

FIG. 1A is a schematic cross-sectional view of a semiconductor device 101, and FIG. 1B is a plan view of the semiconductor device 101.

FIG. 1A is a cross-sectional view taken along a line A1-A2 illustrated in FIG. 1B. FIG. 1B is a plan view of the top of FIG. 1A.

The semiconductor device 101, for example, is a high electron mobility transistor (HEMT) that uses a nitride semiconductor as material.

As illustrated in FIG. 1A, the semiconductor device 101 includes a first semiconductor layer 11, a second semiconductor layer 12, a source electrode 21, a drain electrode 22, a gate electrode 23, a gate insulating film 40, interlayer insulating films 41 and 42, a first field plate electrode (FP electrode 31), and a second field plate electrode (FP electrode 32).

To enhance understanding, the gate insulating film 40 and the interlayer insulating films 41 and 42 are omitted in the plan view of FIG. 1B.

In FIG. 1A, a direction from the first semiconductor layer 11 to the second semiconductor layer 12 is the Z axis direction. A direction that is perpendicular to the Z axis direction is the X axis direction. A direction that is perpendicular to the Z axis direction and the X axis direction is the Y axis direction.

The first semiconductor layer 11 is a channel layer and contains $Al_{x1}Ga_{1-x1}N$ ($0 \leq x1 < 1$).

The second semiconductor layer 12 is disposed over the first semiconductor layer 11. The second semiconductor layer 12 is a barrier layer and contains $Al_{x2}Ga_{1-x2}N$ ($x1 < x2 < 1$). The first semiconductor layer 11 and the second semiconductor layer 12 forms a heterojunction.

The second semiconductor layer 12 includes a first semiconductor part 12a and a second semiconductor part 12b. The second semiconductor part 12b has a thickness smaller than that of the first semiconductor part 12a. In the plan view of FIG. 1B, the portion shaded with dots corresponds to the second semiconductor part 12b.

For example, the thickness T1 of the first semiconductor part 12a is between 20 nm and 30 nm inclusive. The thickness T2 of the second semiconductor part 12b is between 10 nm and 20 nm (both inclusive).

The source electrode 21 and the drain electrode 22 each are disposed over the second semiconductor layer 12 (over the first semiconductor part 12a). The second semiconductor part 12b is positioned between the location of the source electrode 21 and the drain electrode 22. The source electrode 21 and the drain electrode 22 are electrically connected to the second semiconductor layer 12.

Aluminum (Al), titanium (Ti), nickel (Ni), gold (Au), tungsten (W), molybdenum (Mo), tantalum (Ta), and the like may be used as the material of the source electrode 21 and the drain electrode 22.

The gate electrode 23 is disposed over the second semiconductor layer 12 between the source electrode 21 and the drain electrode 22.

A side Eg1 of the gate electrode 23 on the drain electrode 22 side is positioned over, in the Z direction on FIG. 1, the second semiconductor part 12b. A side Eg2 of the gate electrode 23 on the source electrode 21 side is positioned over, in the Z direction on FIG. 1 the first semiconductor part 12a. A portion of the first semiconductor part 12a extends from a location below the gate electrode 23 to an area below the source electrode 21.

Aluminum (Al), titanium (Ti), nickel (Ni), gold (Au), and the like may be used as the material of the gate electrode 23.

The gate insulating film 40 is disposed between the second semiconductor layer 12 and the gate electrode 23. The gate insulating film 40 is used when necessary. For example, the gate insulating film 40 may be omitted when the gate electrode 23 is a Schottky contact with the second semiconductor layer 12. $SiO_2$, SiN, $Al_2O_3$, $TiO_2$, $Ta_2O_5$, $HfO_2$, $ZrO_2$, or the like is used as material of the gate insulating film 40.

The FP electrode 31 is disposed over, and spaced from, the second semiconductor layer 12. A side Ef1 of the FP electrode 31 on the drain electrode 22 side thereof is positioned over the second semiconductor part 12b in the Z direction of FIG. 1A. A side Ef2 of the FP electrode 31 on the source electrode 21 side is positioned over the first semiconductor part 12a1 in the Z direction of FIG. 1A.

The FP electrode 31 is electrically connected to the gate electrode 23, as shown in FIG. 1A, by direct contact therewith. The FP electrode 31 alternatively may be electrically connected to the source electrode 21, and to not the gate electrode 23.

Aluminum (Al), titanium (Ti), and the like may be used as the material of the FP electrode 31.

The FP electrode 31 includes a conductive portion 31a and a conductive portion 31b. The conductive portion 31b is the portion of the FP electrode 31 that is disposed over the gate electrode 23. The conductive portion 31a is in integral part of the FP electrode 31 extends in the direction of the drain electrode 22 side from the conductive portion 31b and thus is not located over the gate electrode 23. That is, the conductive portion 31a is positioned between the gate electrode 23 and the drain electrode 22 when viewed from the Y axis direction of FIG. 1A.

At least a portion of the conductive portion 31a is positioned over the second semiconductor part 12b. For example, a the side wall Ea1 of the conductive portion 31a on the drain side of FP electrode 31 and the border Ea2 between the conductive portion 31b and conductive portion 31a are both positioned over the second semiconductor part 12b, and thus the entire span of the conductive portion 31b extends over the second semiconductor part 12b.

The interlayer insulating film 41 is disposed over the gate insulating film 40. The interlayer insulating film 41 covers the side surfaces of the gate electrode 23. The gate electrode 23 and the source electrode 21 are insulated from each other by the interlayer insulating film 41, and the gate electrode 23 and the drain electrode 22 are insulated from each other by the interlayer insulating film 41. Silicon oxide ($SiO_2$) or silicon nitride (SiN) is used as material of the interlayer insulating film 41.

The interlayer insulating film 42 is disposed over the interlayer insulating film 41 and the FP electrode 31. Silicon oxide ($SiO_2$) and silicon nitride (SiN) may be used as material of the interlayer insulating film 42.

The FP electrode 32 is disposed over the interlayer insulating film 42. The FP electrode 32 includes a conductive portion 32a and a conductive portion 32b. The conductive portion 32b of the FP electrode 32 extends over the FP electrode 31. The conductive portion 32a is a continuous film extending from the conductive portion 32b, and it extends to the drain electrode 22 side of the conductive portion 32b. That is, the conductive portion 32b is positioned between the FP electrode 31 and the drain electrode 22 when viewed from the Y axis direction of FIG. 1A.

The FP electrode 32 is electrically connected to the source electrode 21. The FP electrode 32 may alternatively be electrically connected to the gate electrode 23, and not to the source electrode 21.

Aluminum (Al), titanium (Ti), and the like may be used as the material of the FP electrode 32.

The semiconductor device 101 includes two field plate electrodes but may include only the first field plate electrode (one of the FP electrode 31 and the FP electrode 32) in the embodiment. The second field plate electrode (the other of the FP electrode 31 and the FP electrode 32) is used when necessary. The FP electrode 31 and the FP electrode 32 alleviate concentration of electric fields induced at the drain electrode 22 side of the gate electrode 23.

The Al composition ratio in the second semiconductor layer 12 is higher than the Al composition ratio in the first semiconductor layer 11. For this reason, the lattice constant of the first semiconductor layer 11 differs from the lattice constant of the second semiconductor layer 12. When the nitride semiconductors having a different lattice constant form a heterojunction, the difference between the lattice constants causes distortion in the interface between the nitride semiconductors, thus applying stress to the first semiconductor layer 11. This stress generates piezoelectric effect, and a high density free electron region 11g is formed near the interface of the first semiconductor layer 11. The high density free electron region 11g forms a channel area of the transistor.

The concentration of the two-dimensional electron gas under the gate electrode 23 is increased or decreased by controlling a voltage applied to the gate electrode 23 in the semiconductor device 101. Accordingly, a current flowing between the source electrode 21 and the drain electrode 22 may be controlled. The semiconductor device 101 may be a normally-on type or may be a normally-off type that is described below.

The distortion of the nitride semiconductor caused by the difference of the lattice constants increases when the second semiconductor layer 12 formed over the first semiconductor layer 11 is thick as compared to the thickness of the first semiconductor layer 11. For this reason, the free electron density of the two-dimensional electron gas formed increases when the second semiconductor layer 12 is thick. The second semiconductor part 12b is thinner than the first semiconductor part 12a. For this reason, the free electron density in the two-dimensional electron gas generated under the second semiconductor part 12b is smaller than the density of the two-dimensional electron gas generated under the first semiconductor part 12a.

Figure 2:
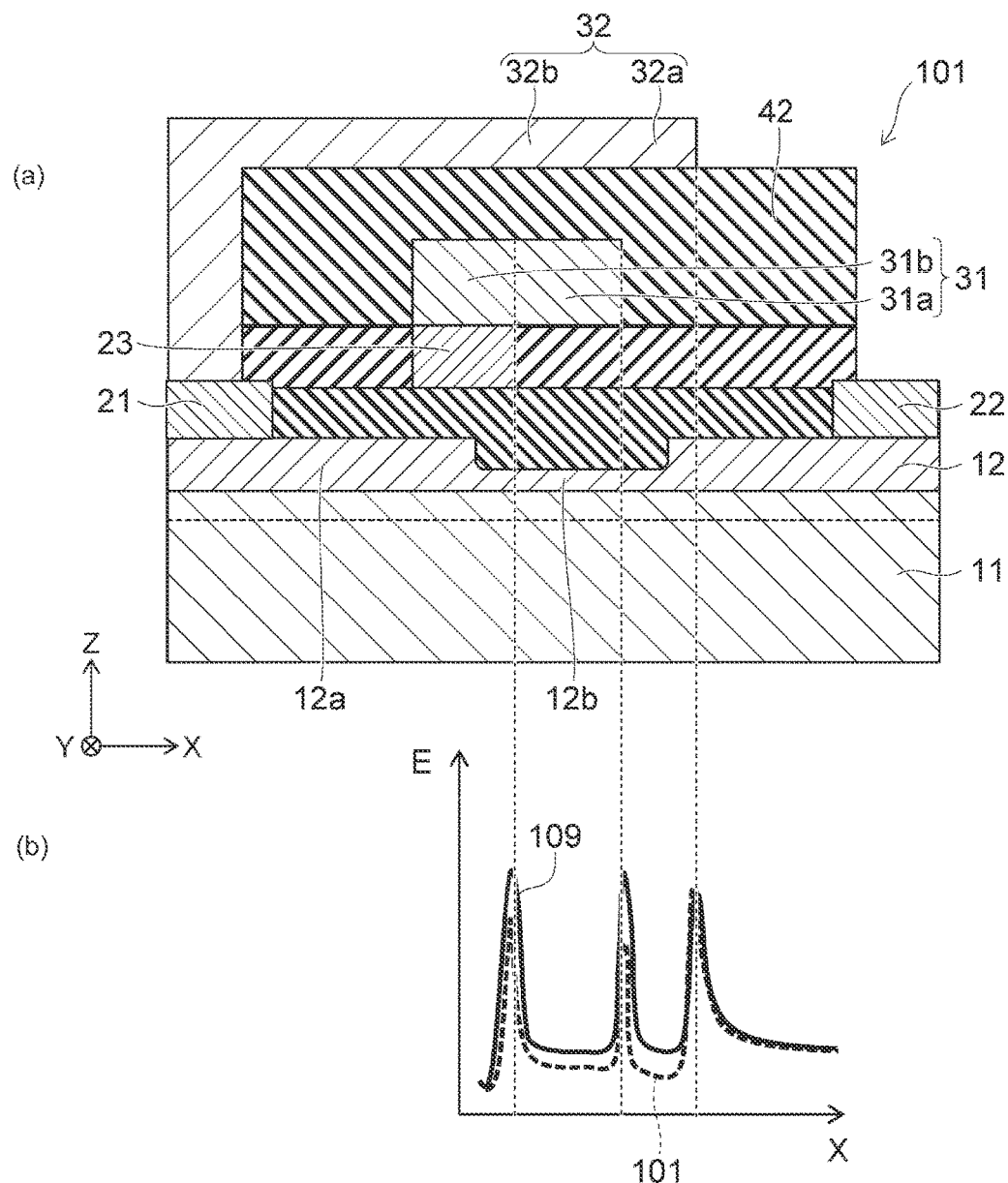
FIG. 2 has a part (a) and part (b) that are schematic views illustrating a characteristic of the semiconductor device according to the first embodiment.

Part (a) of FIG. 2 is a schematic view illustrating a characteristic of the semiconductor device 101 according to the first embodiment.

Part (b) of FIG. 2 is a graph illustrating an electric field strength E in the semiconductor device 101 along the X axis direction. In addition, an electric field strength E in a reference example of a semiconductor device which does not include the reduced thickness portion (second semiconductor part 12b) is also illustrated in part (b) of FIG. 2. But for the lack of a reduced thickness portion in the second semiconductor layer 12, the configuration of the semiconductor device of the reference example is the same as the configuration of the semiconductor device 101.

The electric field strength E is strength of an electric field when a high voltage is applied among the source electrode 21, the gate electrode 23, and the drain electrode 22.

Electric fields are likely to be concentrated locally on the side of the conductive portion 31a on the drain side thereof when the FP electrode is disposed as illustrated in FIG. 2.

In addition, electric fields are likely to be concentrated locally on the side of the gate electrode 23 on the drain electrode 22 side thereof. That is, electric fields are likely to be concentrated locally under the side of the conductive portion 31a at the interface thereof with the conductive portion 31b, i.e., on the source side thereof.

When the strength of the concentrated electric fields is excessively high, an electrical breakdown may occur in the interlayer insulating film, and the semiconductor device may fail. Suppressing such an electric field is desirable for increasing a breakdown voltage of the semiconductor device.

For example, the strength of an electric field between the FP electrode 31 and the second semiconductor layer 12 depends on the density of the a high density free electron region 11g under the FP electrode 31. Decreasing the density of the electron gas 11g under the FP electrode 31 decreases the strength of the electric field between the FP electrode 31 and the second semiconductor layer 12.

Meanwhile, ON resistance increases when the density of the a high density free electron region 11g is decreased by thinning the second semiconductor layer 12 because the a high density free electron region 11g is used as a channel. The increasing ON resistance may degrade a characteristic (for example, a characteristic of an ON current) of the semiconductor device 101. That is, the ON current and the breakdown voltage are in a trade-off relationship.

The FP electrode 31 includes the conductive portion 31a that is positioned between the gate electrode 23 and the drain electrode 22 in the X axis direction. Electric fields are correspondingly concentrated at the side of the conductive portion 31a. The conductive portion 31a is disposed over the thinner second semiconductor part 12b in the semiconductor device 101. For this reason, the distortion of the first semiconductor layer 11 caused by lattice mismatch between the first and second semiconductor layers decreases under the side of the conductive portion 31a. The decreasing distortion decreases the piezoelectric effect and the density of the high density free electron region 11g. Accordingly, the electric field strength may be decreased at places where electric fields are likely to be concentrated. As illustrated in part (b) of FIG. 2, the electric field strength E in the semiconductor device 101 may be decreased compared with the electric field strength E in a reference example of the semiconductor device 109 where the second semiconductor layer is not thinned. Thus, the breakdown voltage of the resulting device may be increased.

Furthermore, a part of the second semiconductor layer 12 that corresponds to a part (for example, a part between the source electrode 21 and the gate electrode 23) where electric fields are unlikely to be concentrated is comparatively thick in the embodiment. For example, the source electrode side of the gate electrode 23 the source electrode 21 side of the FP electrode 31 are positioned over the first semiconductor part 12a. When the second semiconductor layer 12 is thick, the piezoelectric effect increases in the first semiconductor layer 11, and the density of the two-dimensional electron gas increases. For this reason, high carrier density is maintained at the part where electric fields are unlikely to be concentrated. Accordingly, the increasing ON resistance may be suppressed.

According to the present embodiment, the electric field strength at the portions of the device where electric fields are likely to be concentrated may be decreased, and the breakdown voltage may be increased as described above.

Figure 3A:
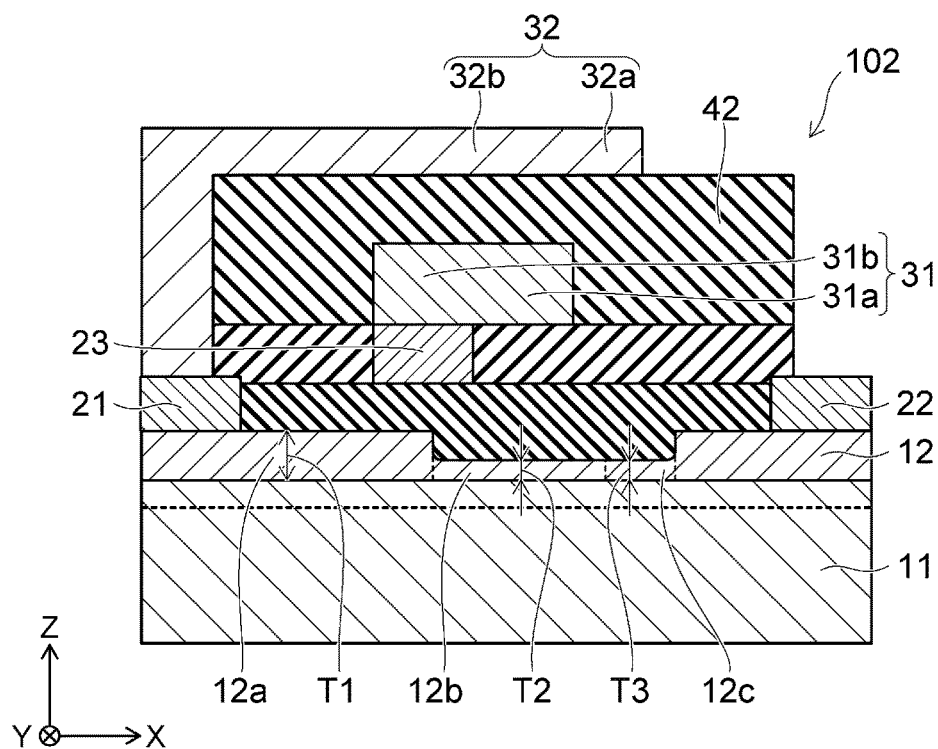
FIG. 3A and FIG. 3B are schematic views illustrating another semiconductor device according to the first embodiment.
Figure 3B:
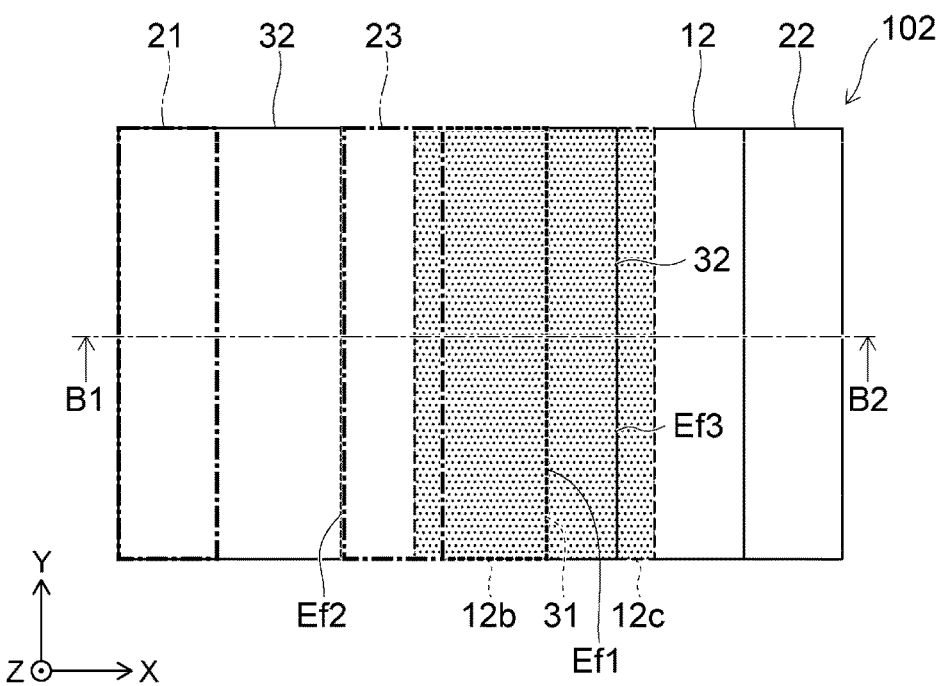

FIG. 3A and FIG. 3B are schematic views illustrating another semiconductor device according to the first embodiment. FIG. 3A is a schematic cross-sectional view of a semiconductor device 102, and FIG. 3B is a see-through plan view of the semiconductor device 102.

FIG. 3A is a cross-sectional view taken along a line B1-B2 in FIG. 3B. FIG. 3B is a plan view from the top of FIG. 3A.

The semiconductor device 102 includes a second semiconductor layer 12 that is different from that of the semiconductor device 101 in shape. The remainder of the semiconductor device 102 elements that are the same as the configurations of the semiconductor device 101 described are given the same reference signs, and descriptions thereof are omitted.

The second semiconductor layer 12 of the semiconductor device 102 further includes a third semiconductor part 12c. The third semiconductor part 12c is a part of the second semiconductor part 12b extending from the second semiconductor part 12bb in the direction of the drain electrode 22 side. That is, the thickness T3 of the third semiconductor part 12c is smaller than the thickness of the first semiconductor part 12a.

In FIG. 3B, the portion shaded with dots corresponds to the second semiconductor part 12b and the third semiconductor part 12c.

The drain electrode 22 side of the FP electrode 32 is positioned over the third semiconductor part 12c.

Electric fields are likely to be concentrated at the drain 22 side of the FP electrode 32 (see part (b) of FIG. 2). In the semiconductor device 102, the thickness of the second semiconductor layer 12 is small under the drain side portion of the FP electrode. Distortion of the semiconductor layers 11, 12 at their interface, and the resulting density of the two-dimensional electron gas, decrease in the part of the first semiconductor layer 11 under the portion of the second semiconductor layer 12 of which the thickness is smaller. For this reason, capacitance between the first semiconductor layer 11 and the conductive portion 32a may be decreased, and the electric field strength may be decreased.

Figure 4A:
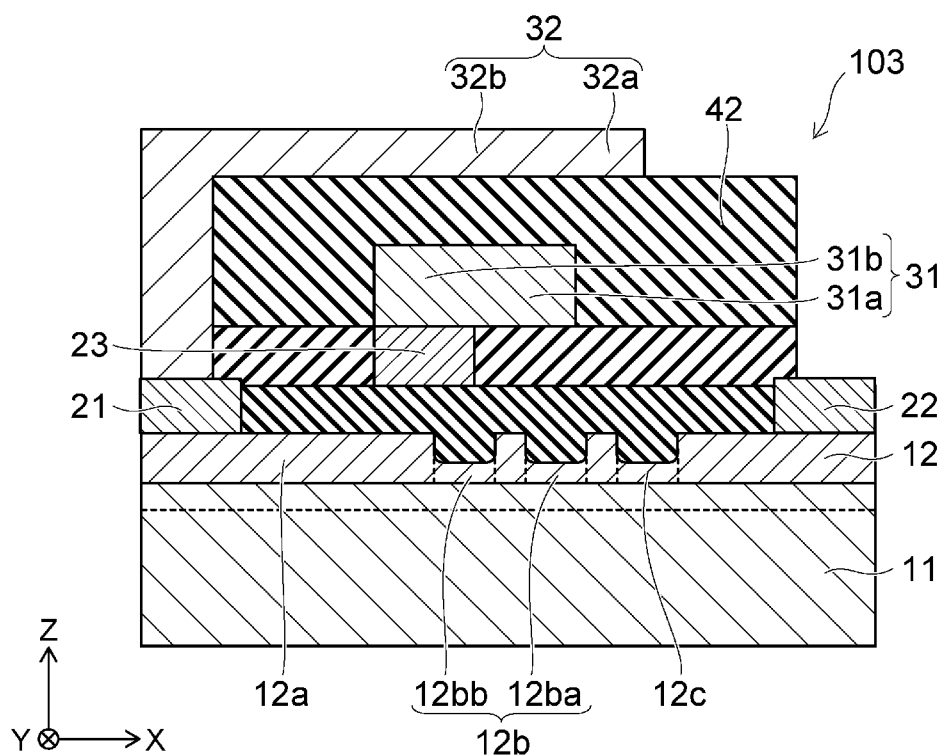
FIG. 4A and FIG. 4B are schematic views illustrating another semiconductor device according to the first embodiment.
Figure 4B:
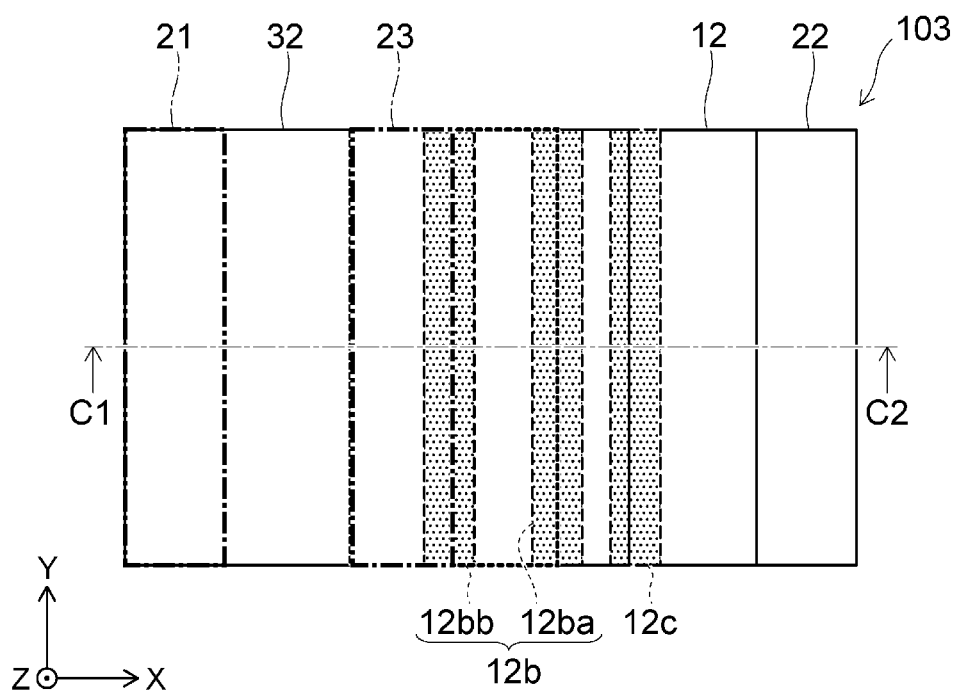

FIG. 4A and FIG. 4B are schematic views illustrating another semiconductor device according to the first embodiment. FIG. 4A is a schematic cross-sectional view illustrating a semiconductor device 103, and FIG. 4B is a see-through plan view illustrating the semiconductor device 103.

FIG. 4A is a cross-sectional view taken along a line C1-C2 in FIG. 4B. FIG. 4B is a plan view from the top of FIG. 4A.

The semiconductor device 103 includes a second semiconductor layer 12 that is different from those of the semiconductor devices 101 and 102 in shape. Other elements of the semiconductor device 103 that are the same as the elements of the semiconductor devices 101 and 102 described are given the same reference signs and numerals, and descriptions thereof are omitted.

The part of the second semiconductor layer in which the thickness is small (the second semiconductor part 12b and the third semiconductor part 12c) is disposed in the semiconductor device 103. In the semiconductor device 103, the second semiconductor part 12b includes a plurality of areas (areas 12ba and 12bb) that are spaced from one another in the X axis direction.

The second semiconductor layer 12 is thinned corresponding to the position where electric fields are likely to be concentrated (the drain side of the FP electrode 32, the drain side of the FP electrode 31, and the drain side of the gate electrode 23). For this reason, the strength of the peak electric field may be decreased as with the semiconductor devices 101 and 102.

Therefore, the position or the shape of the part of the second semiconductor layer 12 of which the thickness is small may be appropriately changed. For example, only a part of the second semiconductor layer 12 that corresponds to the position where electric fields are likely to be concentrated is thinned. Accordingly, the strength of a peak electric field may be decreased only where electric fields are likely to be concentrated. High carrier density may be maintained in the first semiconductor layer 11 under the part of the second semiconductor layer 12 of which the thickness is not small. Accordingly, an increase in ON resistance may be further suppressed.

Figure 5:
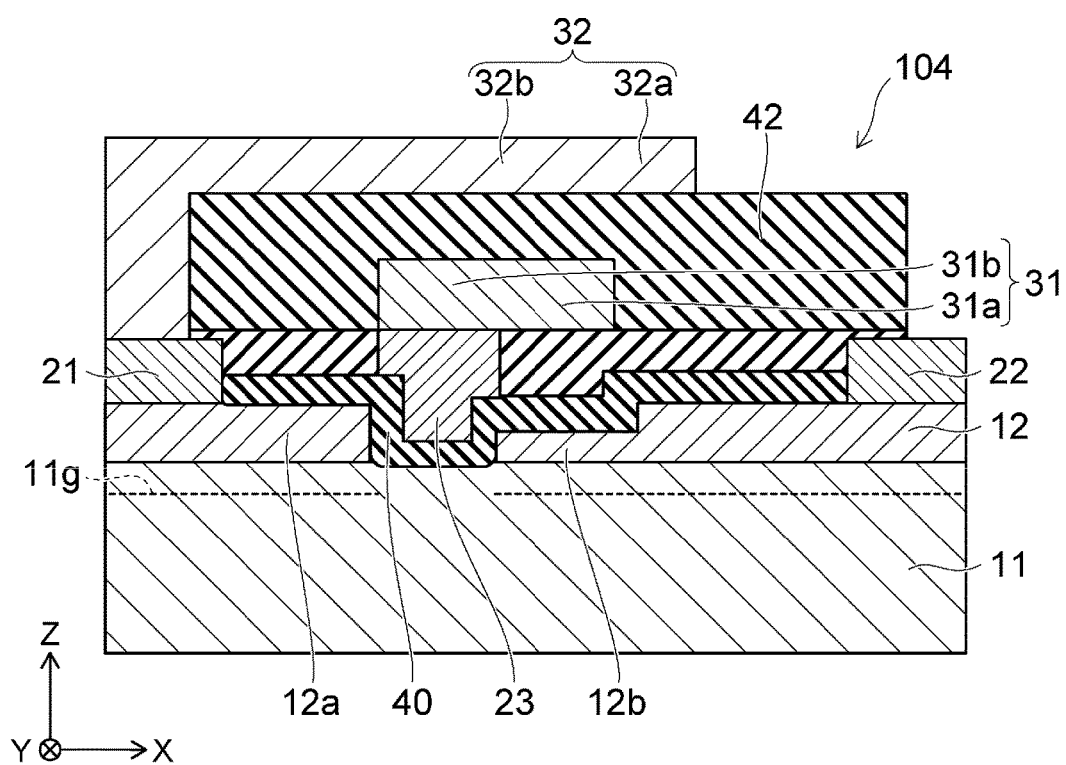
FIG. 5 is a schematic cross-sectional view illustrating another semiconductor device according to the first embodiment.

FIG. 5 is a schematic cross-sectional view illustrating another semiconductor device according to the first embodiment.

A semiconductor device 104 illustrated in FIG. 5 includes a second semiconductor layer 12 that is different from that of the semiconductor device 101 in shape. Other elements of the semiconductor device 104 that are the same as the elements of the semiconductor device 101 described with respect to FIGS. 1A and 1B are given the same reference signs and numerals, and descriptions thereof are omitted. The semiconductor device 104 is a normally-off semiconductor device.

The second semiconductor layer 12 is divided under the gate electrode 23 in the semiconductor device 104. That is, the first semiconductor part 12a and the second semiconductor part 12b of the second semiconductor layer 12 are spaced from each other in the X axis direction. A part of the gate insulating film 40 is disposed between the first semiconductor part 12a and the second semiconductor part 12b and this gate insulating film 40 extends to the first semiconductor layer 11. Accordingly, the a high density free electron region 11g is not generated in the semiconductor layer positioned under the gate electrode 23 when a voltage is not applied to the gate electrode 23. For this reason, the semiconductor device 104 operates as a normally-off type device.

The second semiconductor layer 12 is thinned under the portion of the FP electrode 31 on the drain side thereof and under the portion of the gate electrode 23 on the drain side thereof. Accordingly, the electric field strength at the parts of the device where electric fields are likely to be concentrated may be decreased, and the breakdown voltage of the semiconductor device may be increased like in the semiconductor device 101.

Second Embodiment

Figure 6:
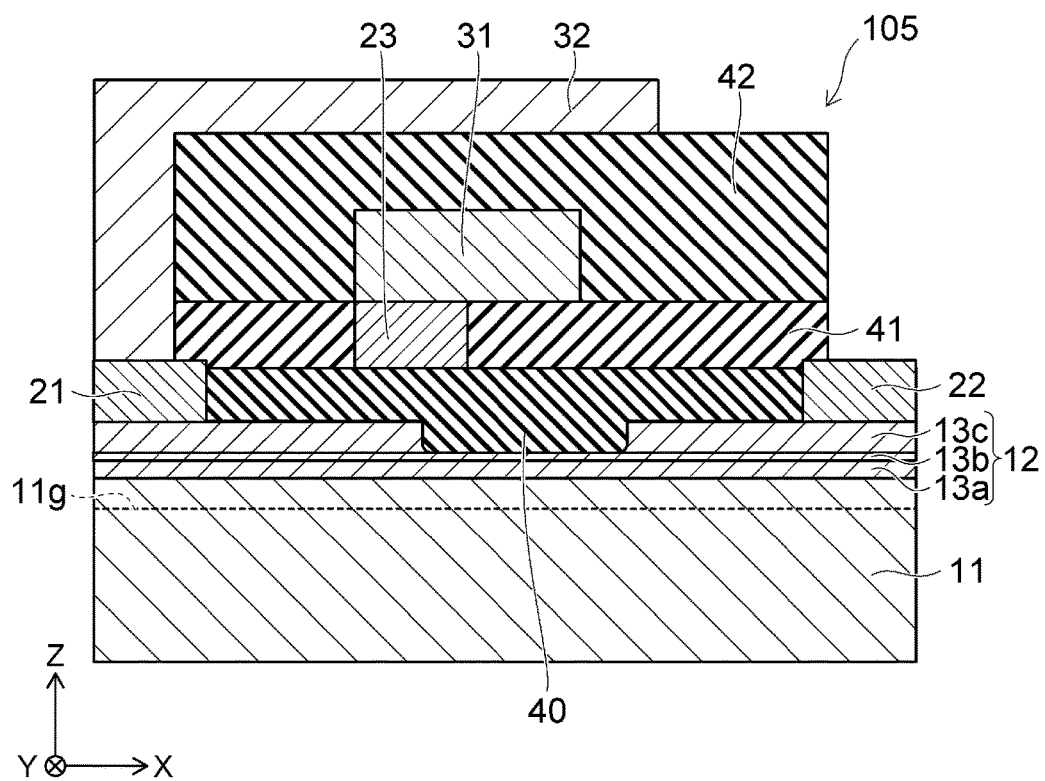
FIG. 6 is a schematic cross-sectional view illustrating a semiconductor device according to a second embodiment.

FIG. 6 is a schematic cross-sectional view illustrating a semiconductor device 105 according to a second embodiment.

In this embodiment, the second semiconductor layer 12 has a stacked structure as illustrated in FIG. 6. Other portions of the semiconductor device 105 that are the same as the portions of the semiconductor device 101 given the same reference signs and numbers, and repeated descriptions thereof are omitted herein.

The second semiconductor layer 12 has a stacked structure and includes first to third layers 13a to 13c.

The first layer 13a is disposed over the first semiconductor layer 11 and is in contact with the first semiconductor layer 11. The first layer 13a includes $Al_{x2}Ga_{1-x2}N$ ($x1<x2<1$).

The second layer 13b is disposed over the first layer 13a and is in contact with the first layer 13a. The second layer 13b is an AlN layer. The thickness of the second layer is between 1 nm and 3 nm (both inclusive).

The third layer 13c is disposed over the second layer 13b and is in contact with the second layer 13b. The third layer 13c includes $Al_{x2}Ga_{1-x2}N$ ($x1<x2<1$).

Next, a method for manufacturing the semiconductor device 105 will be described with reference to FIG. 7A to FIG. 7E.

FIG. 7A to FIG. 7E are schematic cross-sectional views illustrating a process of manufacturing the semiconductor device according to the second embodiment. The first semiconductor layer 11 is not displayed in these drawings.

Figure 7A:
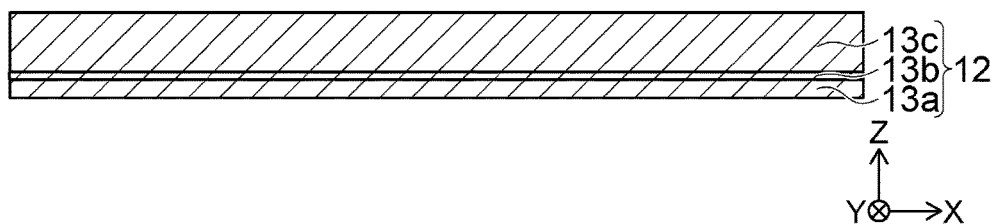
FIG. 7A to FIG. 7E are schematic cross-sectional views illustrating a process of manufacturing the semiconductor device according to the second embodiment.

As illustrated in FIG. 7A, the first to the third layers 13a to 13c of the second semiconductor layer 12 are formed over a wafer on which the first semiconductor layer 11 is formed.

Figure 7B:
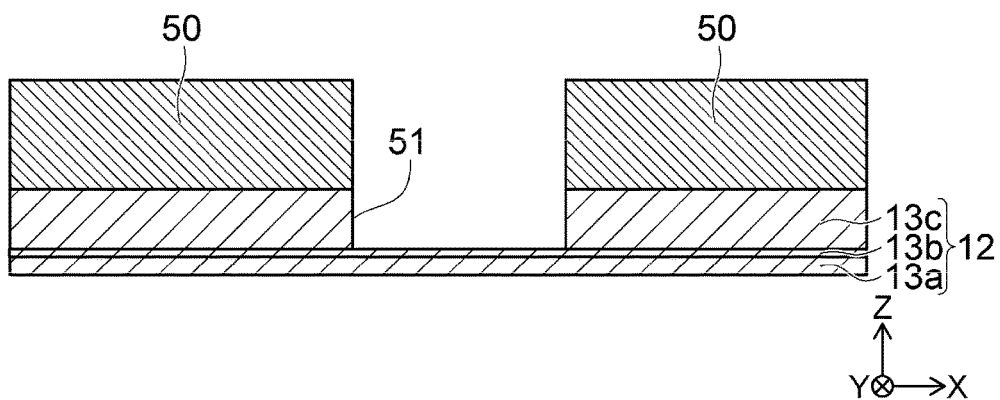

Thereafter, a patterned etching mask 50 is photolithographically formed over the second semiconductor layer 12 as illustrated in FIG. 7B. Then, the third layer 13c is selectively etched by using reactive ion etching (RIE). Accordingly, a recessed portion 51 is formed in the second semiconductor layer 12. Meanwhile, wet etching and the like may be also used in the embodiment to etch the third layer 13c.

Figure 7C:
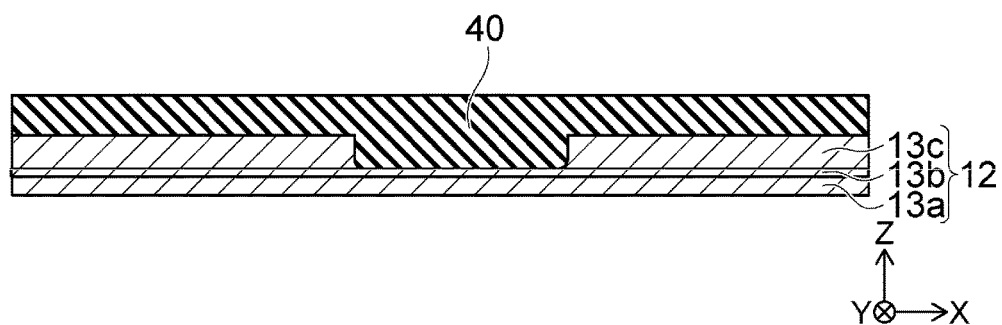

Thereafter, the etching mask 50 is removed, and the gate insulating film 40 is formed over the second semiconductor layer 12 as illustrated in FIG. 7C. The gate insulating film 40 is a silicon oxide film and may be formed by using atomic layer deposition (ALD) or chemical vapor deposition (CVD).

Figure 7D:
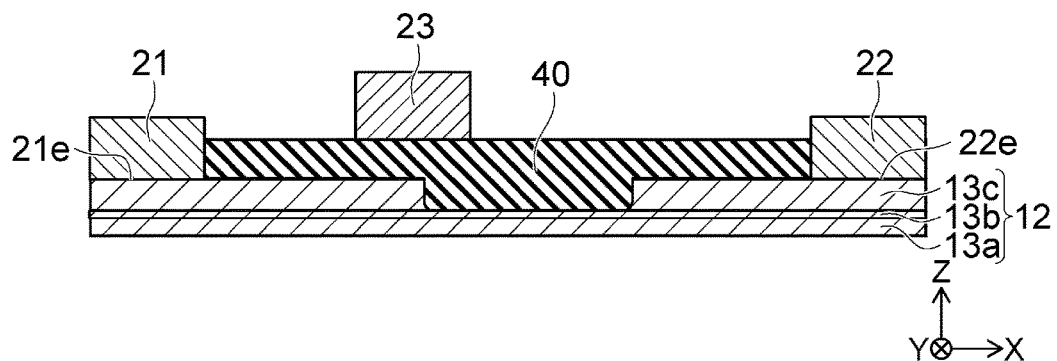

Thereafter, as illustrated in FIG. 7D, a film that becomes the gate electrode 23 is formed over the gate insulating film 40, and is processed through photolithographic (patterned masking) and RIE techniques to form the gate electrode 23.

In addition, an opening 21e and an opening 22e are formed in the gate insulating film 40. The opening 21e is formed at the position where the source electrode 21 is disposed. The opening 22e is formed at the position where the drain electrode 22 is disposed. Thereafter, the source electrode 21 and the drain electrode 22 are respectively formed inside the opening 21e and the opening 22e.

Figure 7E:
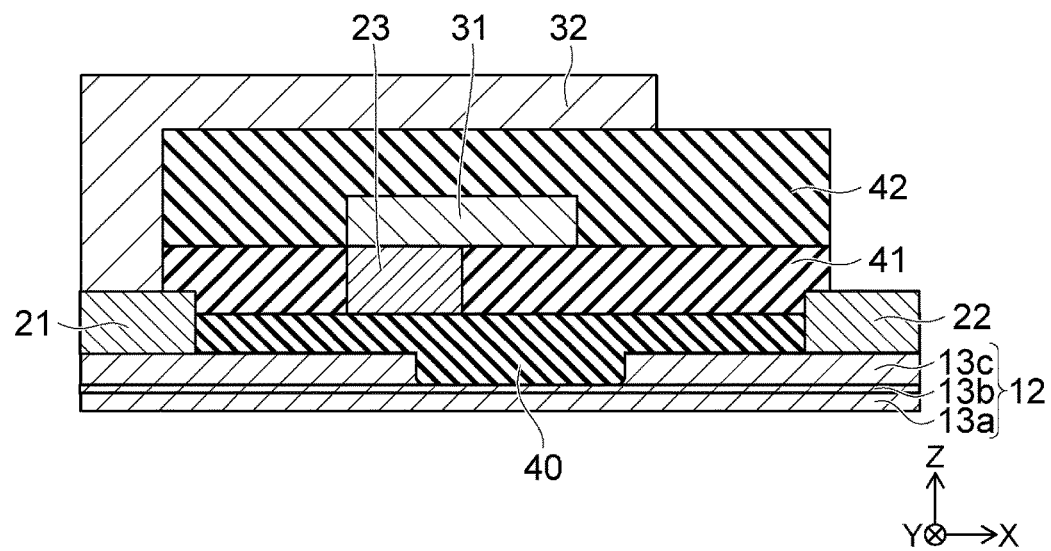

Next, the interlayer insulating film 41 is formed and pattern etched, and the FP electrode 31 is formed in the opening in the interlayer insulating film 41 and over the gate electrode 23 by using CVD deposition, followed by pattern masking of the metal layer from which the FP electrode 31 is formed, and RIE to remove the metal other than in the location of the FP electrode 31. Then, the interlayer insulating film 42 that covers the FP electrode 31 and the interlayer insulating film 41 is formed. Furthermore, with the result as illustrated in FIG. 7E, a metal to form the FP electrode 32 is formed over the top and sides of the interlayer insulating film 42, and is selectively etched through a patterned mask to form the FP electrode 32 over the source electrode 21 and the interlayer insulating film 42.

Each electrode may also be formed by first depositing a conductive film that includes a titanium nitride (TiN) film which covers the inner surface of the opening and a tungsten (W) film which is formed over the TiN film, and then etching back the portion of the conductive film overlying and extending other than in the opening selectively.

In this example, the etching mask 50 is directly formed over the second semiconductor layer 12 to form the recess portion 51 as illustrated in FIG. 7B. Alternatively, the gate insulating film 40 may be formed over the second semiconductor layer 12, and the etching mask may be formed thereover. Thereafter, the recess portion may be formed by selectively etching portions of the gate insulating film 40 and the third layer 13c. The order of the process described above may be appropriately changed, or another process may be appropriately added to the above process to the technically possible extent.

In addition, the thickness of the second semiconductor part 12b is appropriately determined by the design of the semiconductor device. For example, the strength of an electric field that causes an electrical breakdown depends on the thickness, material, or the like of the interlayer insulating film. The thickness of the second semiconductor part 12b is determined so that the strength of a peak electric field inside the semiconductor device is smaller than the strength of an electric field that causes electrical breakdown of the interlayer dielectric film.

Variations may occur in the amount of etching through the process of forming the recess portion in the second semiconductor layer 12. That is, the thickness of the second semiconductor layer 12 may vary. As described above, the density of the two-dimensional electron gas depends on the thickness of the second semiconductor layer 12. For this reason, variations in the amount of etching lead to variations in the density of the two-dimensional electron gas. Variations in the density of the two-dimensional electron gas causes the ON resistance of the transistor to vary.

On the contrary, the second semiconductor layer 12 according to the present embodiment has a layered structure, and the third layer 13c and the second layer 13b have a different composition. For this reason, the etch rates of the third layer 13c and the second layer 13b are different. When etching the second semiconductor layer 12, the third layer 13c is etched first, and the second layer 13b is etched next. Changes in the etching characteristics are detected when the third layer has been etched through to expose the underlying second layer. Accordingly, etching may be stopped at the surface of the second layer 13b. Thus, the amount of etching may be controlled, and the thickness of the second semiconductor layer 12 may be adjusted with high accuracy. Therefore, variations in the thickness of the second semiconductor layer 12 may be suppressed.

As described above, the distortion in the interface between the first semiconductor layer 11 and the second semiconductor layer 12 depends on the thickness of the second semiconductor layer 12. Suppressing variations in the thickness of the second semiconductor layer 12 may suppress variations in the distortion of the second semiconductor layer 12 and the first semiconductor layer 11 that form a junction with each other. Accordingly, variations in the density of the two-dimensional electron gas may be suppressed. Therefore, variations in a characteristic of the ON resistance or the ON current may be suppressed.

According to the embodiment, the semiconductor device that may suppress degradation of the characteristic and may increase the breakdown voltage is provided by thinning the second semiconductor layer 12 corresponding to the part where electric fields are likely to be concentrated.

In the present disclosure, "nitride semiconductor" is assumed to include Group III-V compound semiconductors of $B_x In_y Al_z Ga_{1-x-y-z} N$ ($0 \le x \le 1$, $0 \le y \le 1$, $0 \le z \le 1$, $0 \le x+y+z \le 1$), and further, mixed crystals that contain phosphorus (P), arsenic (As), or the like besides nitrogen (N) are also assumed to be included as the Group V elements in the nitride semiconductor. Furthermore, "nitride semiconductor" also includes ones that further include various elements added for controlling properties of materials such as conductivity and the like and ones that further include various elements unintentionally.

In the present disclosure, "perpendicular" is not only intended to include strict perpendicular but also includes variation and the like resulting from a manufacturing process, for example, and may be substantially perpendicular.

Hereinbefore, the exemplary embodiments are described with reference to the specific examples. However, the exemplary embodiments are not limited to the specific examples. For example, regarding the specific configuration of each configuration such as the first semiconductor layer, the second semiconductor layer, the source electrode, the drain electrode, the gate electrode, and the field plate electrode, embodiments performed by those skilled in the related art by appropriately selecting the configurations from a range of components in the related art are included in the range of the exemplary embodiments provided that the embodiments may be performed in the same manner as those of the exemplary embodiments, and the same effect may be achieved.

In addition, combinations of two or more of the specific examples to the technically possible extent are also included in the range of the exemplary embodiments provided that the combinations include the gist of the exemplary embodiments.

Besides, any semiconductor device that may be embodied by those skilled in the related art by appropriately modifying the design of the semiconductor device described above as the embodiments of the exemplary embodiments also falls within the range of the exemplary embodiments provided that the semiconductor device includes the gist of the exemplary embodiments.

Various modification examples and correction examples may be perceived by those skilled in the related art in the category of the idea of the exemplary embodiments, and these modification examples and correction examples are understood to fall within the range of the exemplary embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a compound semiconductor device, comprising:
   providing a first compound semiconductor layer;
   providing a second compound semiconductor layer on the first compound semiconductor layer, wherein the thickness of the second compound semiconductor layer includes a relatively thick portion and at least one thinner portion;
   depositing, as the second compound semiconductor layer, a first sub-layer of a compound semiconductor material on the first compound semiconductor layer;
   depositing an etch stop layer on the first sub-layer of a compound semiconductor material;
   depositing a second sub-layer of a compound semiconductor material on the etch stop layer; and
   etching an opening through the second sub-layer of a compound semiconductor layer and stopping the etching on the etch stop layer.

2. The method of claim 1, further comprising:
   forming a gate dielectric layer over the second compound semiconductor layer and inwardly of the opening through the second sub-layer of a compound semiconductor material.

3. The method of claim 2, further comprising:
   forming a gate electrode on the gate dielectric layer; and
   forming a drain electrode and a source electrode in contact with the second compound semiconductor layer, wherein the gate electrode is disposed between the source electrode and the gate electrode,
   wherein a first side surface of the gate electrode overlies the opening in the second sub-layer of a compound semiconductor material and a second side surface of the gate electrode overlies the second sub-layer of a compound semiconductor material.

4. The method of claim 3, further comprising:
   forming a first field plate electrode;
   extending the field plate electrode from a location overlying the gate electrode to a location intermediate of the gate electrode and the drain electrode.

5. The method of claim 4, further comprising:
   forming a second field plate electrode over the first field plate electrode; and
   extending a portion of the second field plate electrode from a location overlying the gate electrode to a location closer to the drain electrode than the first field plate electrode.

6. The method of claim 1, further comprising:
   inducing strain in the first compound semiconductor layer adjacent to the juncture thereof with the second compound semiconductor layer to form a channel region in the first semiconductor layer.

7. A nitride semiconductor device, comprising:
   a first compound semiconductor layer;
   a second compound semiconductor layer disposed on the first compound semiconductor layer, wherein the thickness of the second compound semiconductor layer includes a relatively thick portion and at least one thinner portion,
   wherein the second compound semiconductor layer comprises:
   a first sub-layer of a compound semiconductor material disposed on the first semiconductor layer;
   a non-semiconductor layer disposed on the first sub-layer of a compound semiconductor material; and
   a second sub-layer of a compound semiconductor material on the non-semiconductor layer, wherein
   an opening extends through the second sub-layer of a compound semiconductor layer to the non-semiconductor layer.

8. The semiconductor device of claim 7, further comprising:
   a gate dielectric layer extending over the second compound semiconductor layer and inwardly of the opening through the second sub-layer of a compound semiconductor material.

9. The semiconductor device of claim 8, further comprising:
   a gate electrode disposed on the gate dielectric layer; and
   a drain electrode and a source electrode in contact with the second compound semiconductor layer, wherein the gate electrode is disposed between the source electrode and the gate electrode, wherein
   a first side surface of the gate electrode overlies the opening in the second sub-layer of a compound semiconductor material and a second side surface of the gate electrode overlies the second sub-layer of a compound semiconductor material.

10. The semiconductor device of claim 9, further comprising:
    a first field plate electrode extending from a location overlying the gate electrode to a location intermediate of the gate electrode and the drain electrode.

* * * * *